United States Patent
Lee

(10) Patent No.: US 7,368,348 B2
(45) Date of Patent: May 6, 2008

(54) METHODS OF FORMING MOS TRANSISTORS HAVING BURIED GATE ELECTRODES THEREIN

(75) Inventor: Sang-Hyeon Lee, Gyeonggi-do (KR)

(73) Assignee: Samsung Electronics Co., Ltd. (KR)

(*) Notice: Subject to any disclaimer, the term of this patent is extended or adjusted under 35 U.S.C. 154(b) by 165 days.

(21) Appl. No.: 11/246,401

(22) Filed: Oct. 7, 2005

(65) Prior Publication Data

US 2006/0105529 A1 May 18, 2006

(30) Foreign Application Priority Data

Nov. 15, 2004 (KR) .................. 10-2004-0093289

(51) Int. Cl.
*H01L 21/336* (2006.01)
(52) U.S. Cl. ............... 438/259; 438/265; 257/331; 257/E21.209
(58) Field of Classification Search ........ 438/217, 438/221, 222, 259, 262, 263, 264, 265, 266, 438/270, 272; 257/E21.209, E21.375, E21.384, 257/E21.41, E21.419, E21.421, E21.429, 257/E21.431, 331
See application file for complete search history.

(56) References Cited

U.S. PATENT DOCUMENTS 5,578,513 A * 11/1996 Maegawa .................. 438/151
6,787,424 B1 * 9/2004 Yu .......................... 438/300
6,936,516 B1 * 8/2005 Goo et al. ................. 438/283
7,002,207 B2 * 2/2006 Kim et al. ................. 257/331

FOREIGN PATENT DOCUMENTS

| JP | 11-008390 | 1/1999 |
|---|---|---|
| JP | 2004-006736 | 1/2004 |
| KR | 1020020078996 A | 10/2002 |
| KR | 1020040029582 A | 4/2004 |

* cited by examiner

*Primary Examiner*—Scott B. Geyer
*Assistant Examiner*—Grant S Withers
(74) *Attorney, Agent, or Firm*—Myers Bigel Sibley & Sajovec

(57) ABSTRACT

Methods of forming field effect transistors having buried gate electrodes include the steps of forming a semiconductor substrate having a sacrificial gate electrode buried beneath a surface of the semiconductor substrate and then removing the sacrificial gate electrode to define a gate electrode cavity beneath the surface. The gate electrode cavity is lined with a gate insulating layer. The lined gate electrode cavity is filled with a first insulated gate electrode. A second insulated gate electrode is also formed on a portion of the semiconductor substrate extending opposite the first insulated gate electrode so that a channel region of the field effect transistor extends between the first and second insulated gate electrodes. Source and drain regions are also formed adjacent opposite ends of the first and second insulated gate electrodes.

14 Claims, 18 Drawing Sheets

METHODS OF FORMING MOS TRANSISTORS HAVING BURIED GATE ELECTRODES THEREIN

REFERENCE TO PRIORITY APPLICATION

This application claims priority to Korean Patent Application No. 2004-93289, filed Nov. 15, 2004, the disclosure of which is hereby incorporated herein by reference.

FIELD OF THE INVENTION

This invention relates to methods of fabricating integrated circuit devices and, more particularly, to methods of forming field effect transistors.

BACKGROUND OF THE INVENTION

With semiconductor devices being more and more highly integrated in recent years, a region for device elements, that is, an active region is being reduced in size, and a channel of a MOS transistor formed in the active region is also being reduced in length. If a length of the channel of a MOS transistor is reduced, an electric field or electric potential in the channel region is more influenced by a source/drain voltage, which is referred to as a short channel effect. Further, with the scaling down of the active region, a width of the channel is also reduced so as to bring an increase in a threshold voltage, which is referred to as a narrow channel effect.

In particular, if there occurs the short channel effect in an access MOS transistor employed in a memory cell of a DRAM device, a threshold voltage of the DRAM cell is reduced, and a leakage current is increased, which results in deteriorating refresh characteristics of the DRAM device. Therefore, various efforts and studies have been actively made in order to optimize performances of devices while scaling down the elements formed on a substrate. As important examples, there have been introduced a vertical type transistor, such as a fin structure and a fully depleted lean-channel transistor (DELTA) structure, and a MOS transistor having a recessed gate electrode. The MOS transistor having the recessed gate electrode is formed by partially recessing a semiconductor substrate, forming a gate in the recessed portion, and forming a channel in the semiconductor substrate of the both sides of the gate. Thus, even though the integration of the semiconductor device is increased, the short channel effect of the MOS transistor can be suppressed by increasing the length of the channel. However, even though the MOS transistor having the recessed gate electrode is effective in suppressing the short channel effect by increasing the length of the channel, the structure of the MOS transistor may not be effective in preventing a narrow channel effect caused by the high integration of the device because a width of the channel remains unchanged.

U.S. Pat. No. 6,413,802 discloses a fin structure MOS transistor in which a plurality of thin parallel channel fins are formed between source/drain regions, and a gate electrode extends to the upper surface and sidewalls of a channel. In the fin structure MOS transistor, since the gate electrode is formed on both sidewalls of the channel fin, and the gate control is possible from the both sidewalls, a short channel effect can be decreased. However, the fin structure MOS transistor has a problem of increasing a source/drain junction capacitance while it has the advantage as above because the plural channel fins are formed in parallel along the width direction of the gate, and the spaces occupied by a channel region and source/drain regions are increased, thereby to increase the number of the channels.

An example of the DELTA structure MOS transistor is disclosed in U.S. Pat. No. 4,996,574. In the DELTA structure MOS transistor, a layer for a channel region in an active region is formed to vertically protrude with a predetermined width. Further, a gate electrode is formed to surround the vertically protruded channel region. Thus, a height of the protruded portion becomes a width of the channel, and a width of the protruded portion becomes a thickness of the channel layer. Since both sides of the protruded portion in the channel formed as above can all be used, the structure provides an effect of doubling the width of the channel, thereby preventing the narrow channel effect. Further, since depletion layers of the channel formed on the both sides are formed to overlap each other in the case of reducing the width of the protruded portion, a channel conductivity can be increased.

However, when the DELTA structure MOS transistor is employed to a bulk type silicon substrate, the substrate must be processed such that a portion for a channel in the substrate is protruded, and the substrate must be processed to be oxidized with the protruded portion covered by an oxidation barrier layer. At this time, if the oxidation is performed excessively, the channel and a substrate body may be separated because a part connecting the protruded portion for the channel and the substrate body is oxidized by the oxygen laterally diffused from the portion, which is not protected by the oxidation barrier layer. As such, if the channel and the substrate body are separated by the excessive oxidation, a thickness of the channel close to the connecting part is reduced, and a single crystal layer is damaged by the applied stress during the oxidation process.

SUMMARY OF THE INVENTION

Methods of forming field effect transistors having buried gate electrodes include the steps of forming a semiconductor substrate having a sacrificial gate electrode buried beneath a surface of the semiconductor substrate and then removing the sacrificial gate electrode to define a gate electrode cavity beneath the surface. The gate electrode cavity is lined with a gate insulating layer. The lined gate electrode cavity is filled with a first insulated gate electrode. A second insulated gate electrode is also formed on a portion of the semiconductor substrate extending opposite the first insulated gate electrode so that a channel region of the field effect transistor extends between the first and second insulated gate electrodes. Source and drain regions are also formed adjacent opposite ends of the first and second insulated gate electrodes.

According to some embodiments of the invention, the step of removing the sacrificial gate electrode is preceded by the steps of forming a trench isolation region in the substrate and etching back a portion of the trench isolation region to thereby expose a portion of the sacrificial gate electrode. The removing step may then include applying a wet etchant to the exposed portion of the sacrificial gate electrode. The lining step may also include thermally oxidizing exposed surfaces in the gate electrode cavity. The step of etching back the portion of the trench isolation region may also be performed simultaneously with etching a surface of the semiconductor substrate to define a recess therein that extends opposite the sacrificial gate electrode. The step of forming a second insulated gate electrode includes forming a second insulated gate electrode on the recess.

In additional embodiments of the present invention, the sacrificial gate electrode includes material selected from a group consisting of silicon nitride and silicon germanium. The steps to form the semiconductor substrate may also include forming a sacrificial gate electrode material layer on a surface of a bulk semiconductor substrate and then patterning the sacrificial gate electrode material layer to define at least a sacrificial gate electrode. The patterned sacrificial gate electrode material layer is then covered with a semiconductor layer comprising silicon. The semiconductor layer is then planarized using an etch back step or chemical-mechanical polishing, for example. This step of covering the patterned sacrificial gate electrode material layer may include epitaxially growing the semiconductor layer as a single crystal silicon layer. Alternatively, the semiconductor layer may be formed by depositing the semiconductor layer as an amorphous silicon layer and then recrystallizing the amorphous silicon layer.

BRIEF DESCRIPTION OF THE DRAWINGS

FIGS. 1A to 7A are plan views illustrating a method of fabricating a MOS transistor having a multiple channel according to an embodiment of the present invention;

FIGS. 1B to 7B are sectional views taken along a line of B-B' of FIGS. 1A to 7a respectively;

FIGS. 1C to 7C are sectional views taken along a line of C-C' of FIGS. 1A to 7A respectively;

FIGS. 8A to 10A are plan views illustrating a method of fabricating a MOS transistor having a multiple channel according to another embodiment of the present invention;

FIGS. 8B to 10B are sectional views taken along a line of B-B' of FIGS. 8A to 10A respectively;

FIGS. 8C to 10C are sectional views taken along a line of C-C' of FIGS. 8A to 10A respectively;

FIGS. 11A to 15A are plan views illustrating a method of fabricating a MOS transistor having a multiple channel according to still another embodiment of the present invention;

FIGS. 11B to 15B are sectional views taken along a line of B-B' of FIGS. 11A to 15A respectively; and FIGS. 11C to 15C are sectional views taken along a line of C-C' of FIGS. 11A to 15A respectively.

DETAILED DESCRIPTION OF THE INVENTION

Figure 1A:
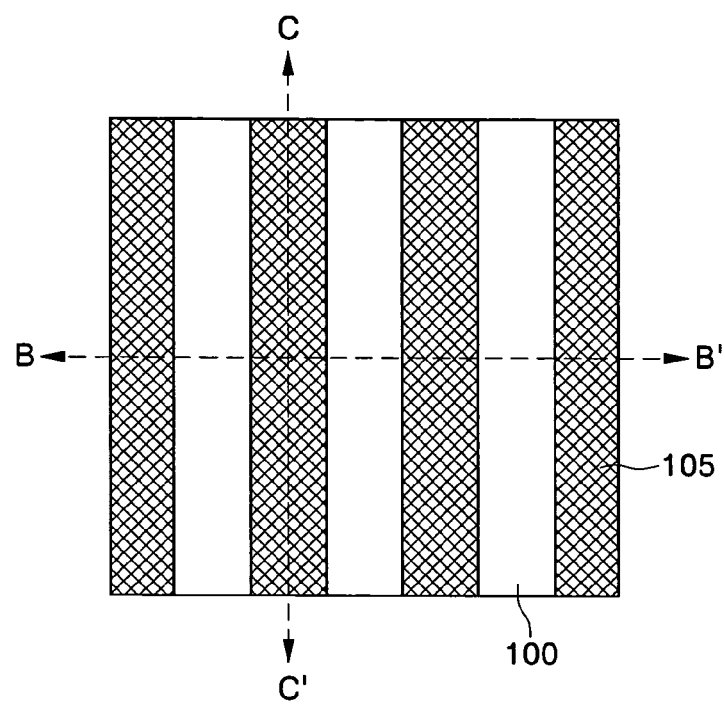
Figure 1B:
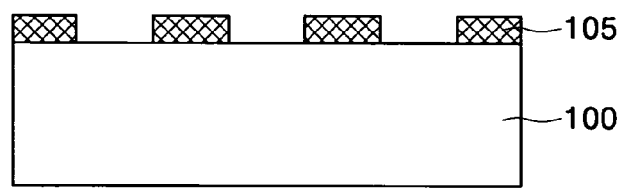
Figure 1C:
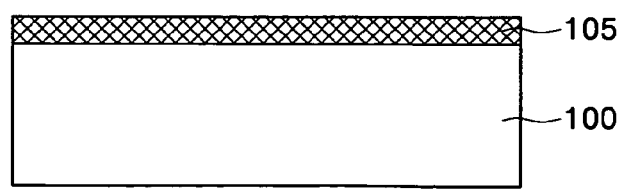

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIGS. 1A to 7A are plan views illustrating a method of fabricating a MOS transistor having a multiple channel according to an embodiment of the present invention. FIGS. 1B to 7B are sectional views taken along a line of B-B' of FIGS. 1A to 7A respectively. FIGS. 1C to 7C are sectional views taken along a line of C-C' of FIGS. 1A to 7A respectively. Referring to FIGS. 1A to 1C, a gate sacrificial layer is formed on a semiconductor substrate 100. The gate sacrificial layer is preferably formed of a material having a wet etch selectivity with respect to silicon and silicon oxide. The gate sacrificial layer may be formed of SiN or SiGe, for example. A line and space shaped photoresist pattern (not shown) is formed on the gate sacrificial layer. The gate sacrificial layer is etched using a dry etch method and using the photoresist pattern as an etching mask to thereby form a gate sacrificial layer pattern 105. Referring to FIGS. 2B to 2C, a single crystal silicon layer is formed on the semiconductor substrate having the gate sacrificial layer pattern 105. Then, the single crystal silicon layer is planarized. As a result, a planarized single crystal silicon layer 110 is formed. The planarization can be performed using a chemical mechanical polishing (CMP) process or etch back process. In an embodiment of the present invention, the single crystal silicon layer may be formed to cover the gate sacrificial layer pattern using a silicon epitaxy method. Alternatively, in another embodiment of the present invention, a lower single crystal silicon layer is formed on the semiconductor substrate having the gate sacrificial layer pattern 105, using a silicon epitaxy method, and an amorphous silicon layer may be formed on the semiconductor substrate having the lower single crystal silicon layer to cover the gate sacrificial layer pattern. Then, the semiconductor substrate having the amorphous silicon layer is annealed to crystallize the amorphous silicon layer, thereby forming a single crystal silicon layer. In still another embodiment of the present invention, the formation of the single crystal silicon layer on the semiconductor substrate having the gate sacrificial layer pattern 105 may include forming an amorphous silicon layer on the semiconductor substrate having the gate sacrificial layer pattern 105. Then, the semiconductor substrate having the amorphous silicon layer is annealed to fully crystallize the amorphous silicon layer. The recrystallized silicon layer may then be planarized to define the single crystal layer 110.

Figure 3A:
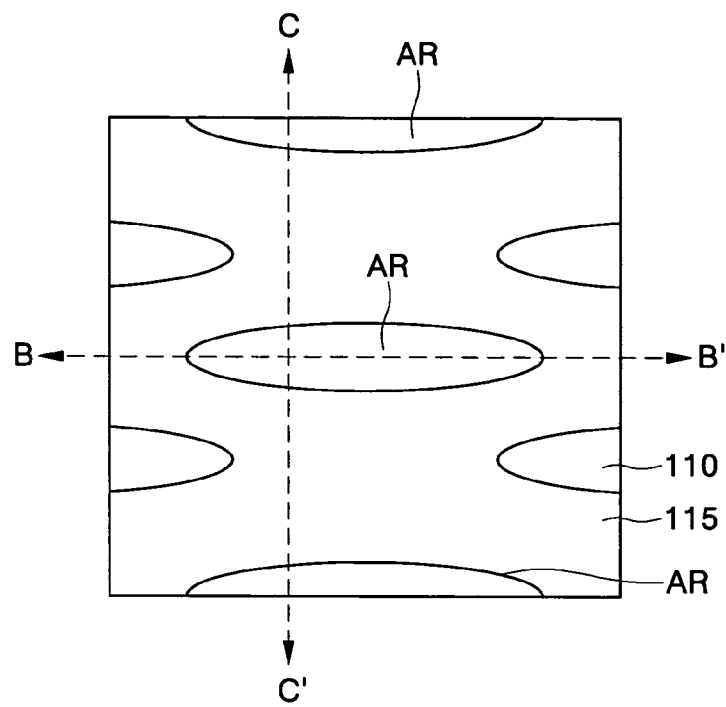
Figure 3B:
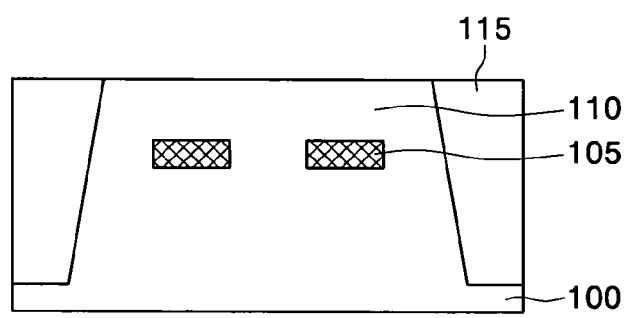
Figure 3C:
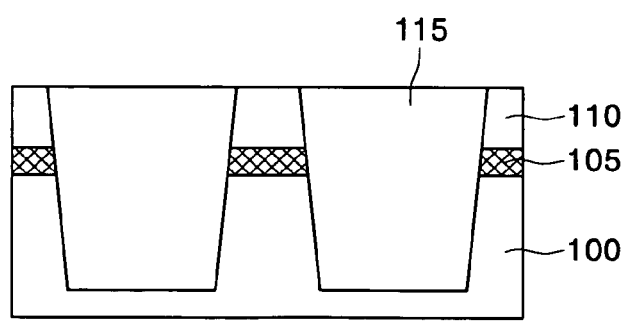

Referring to FIGS. 3A to 3C, a trench isolation layer 115 is formed inside the semiconductor substrate having the planarized single crystal silicon layer 110. As a result, active regions AR are defined. A depth of the trench isolation layer 115 is preferably greater than that of the planarized single crystal silicon layer 110. After the active regions AR is defined, a channel ion implantation process may be performed on the semiconductor substrate, thereby forming a channel doping region (not shown) inside the active regions AR.

Figure 4A:
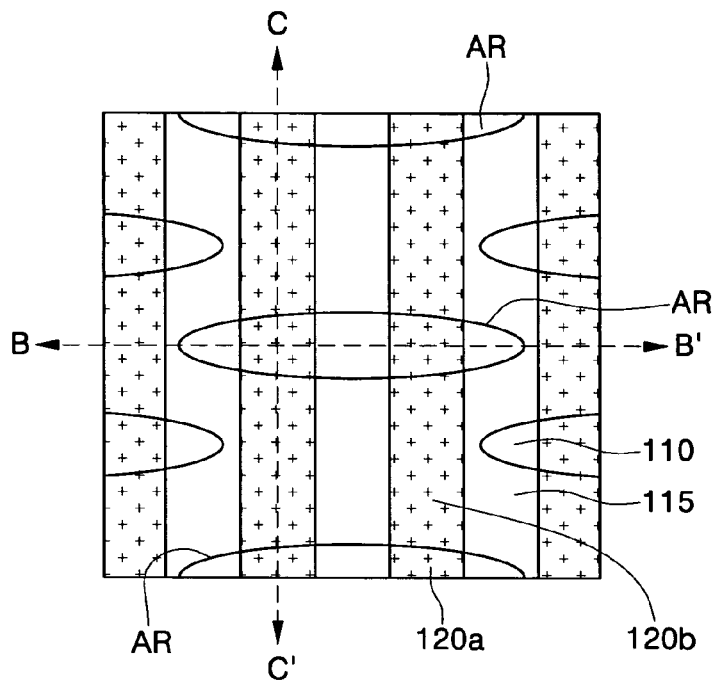
Figure 4B:
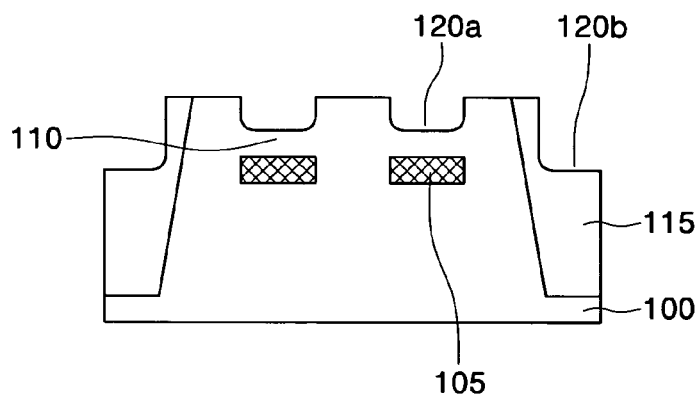
Figure 4C:
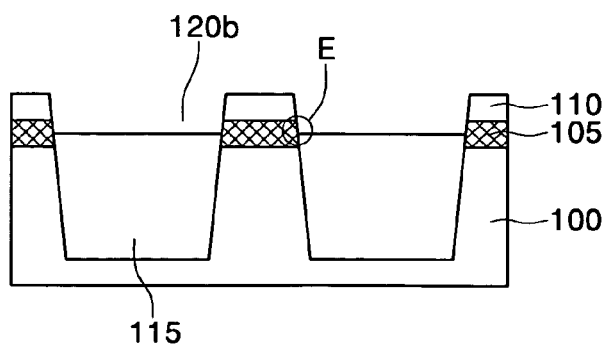

Referring to FIGS. 4A to 4C, the semiconductor substrate having the active regions AR is recessed to run across the active regions AR. Since the trench isolation layer 115 is formed of a silicon oxide layer, the trench isolation layer 115 is recessed more quickly than the single crystal silicon of the active regions AR. By controlling conditions of the recessing, a recess region 120a of the active regions AR is formed, but does not expose the gate sacrificial layer pattern 105. However, a recess region 120b of the trench isolation layer 115 is formed to expose the gate sacrificial layer pattern 105 through recessed trench sidewalls E.

Figure 5A:
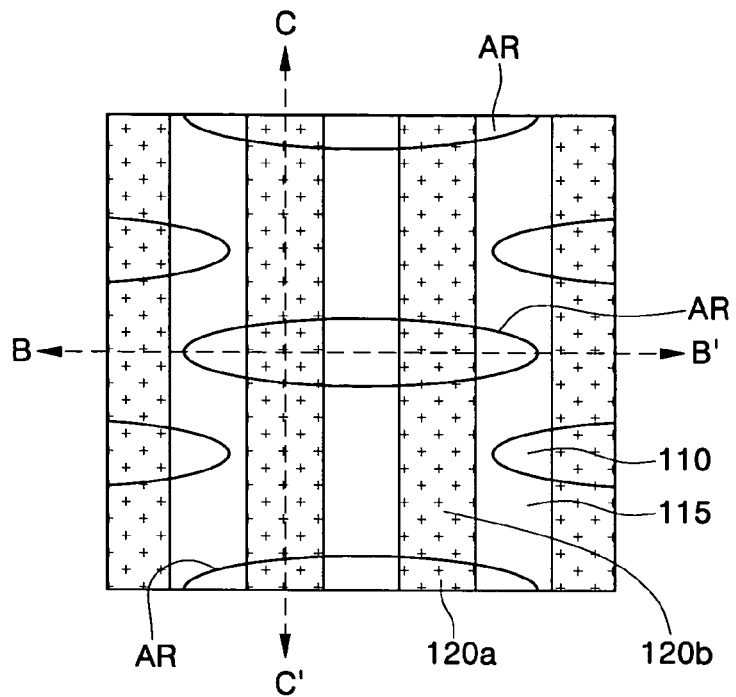
Figure 5B:
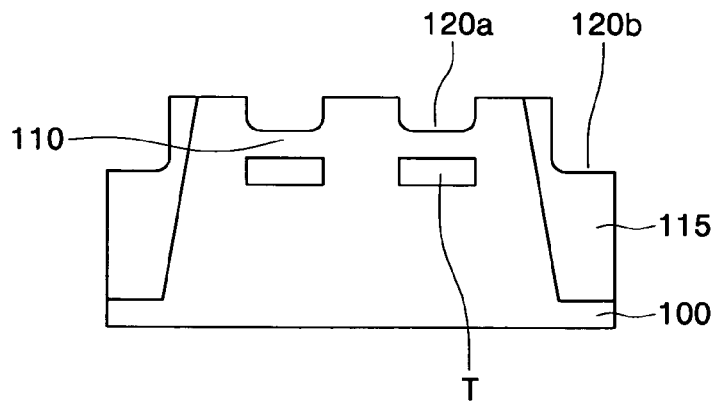
Figure 5C:
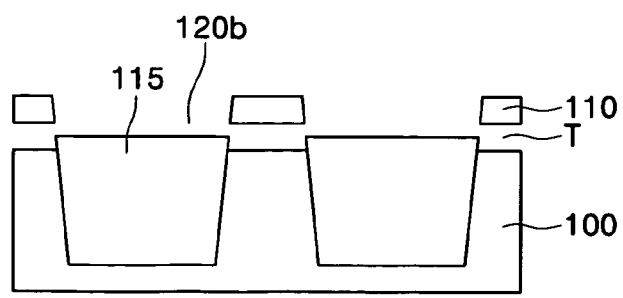

Referring to FIGS. 5A to 5C, the gate sacrificial layer pattern 105 exposed through the recessed trench sidewalls E is removed using a wet etch. As a result, a gate tunnel T is formed to penetrate the inside of the active region AR in the horizontal direction. The wet etch is preferably performed using a wet etch solution having a wet etch selectivity with respect to silicon and silicon oxide. In this embodiment, a phosphoric acid solution may be used as a wet etchant.

Figure 6A:
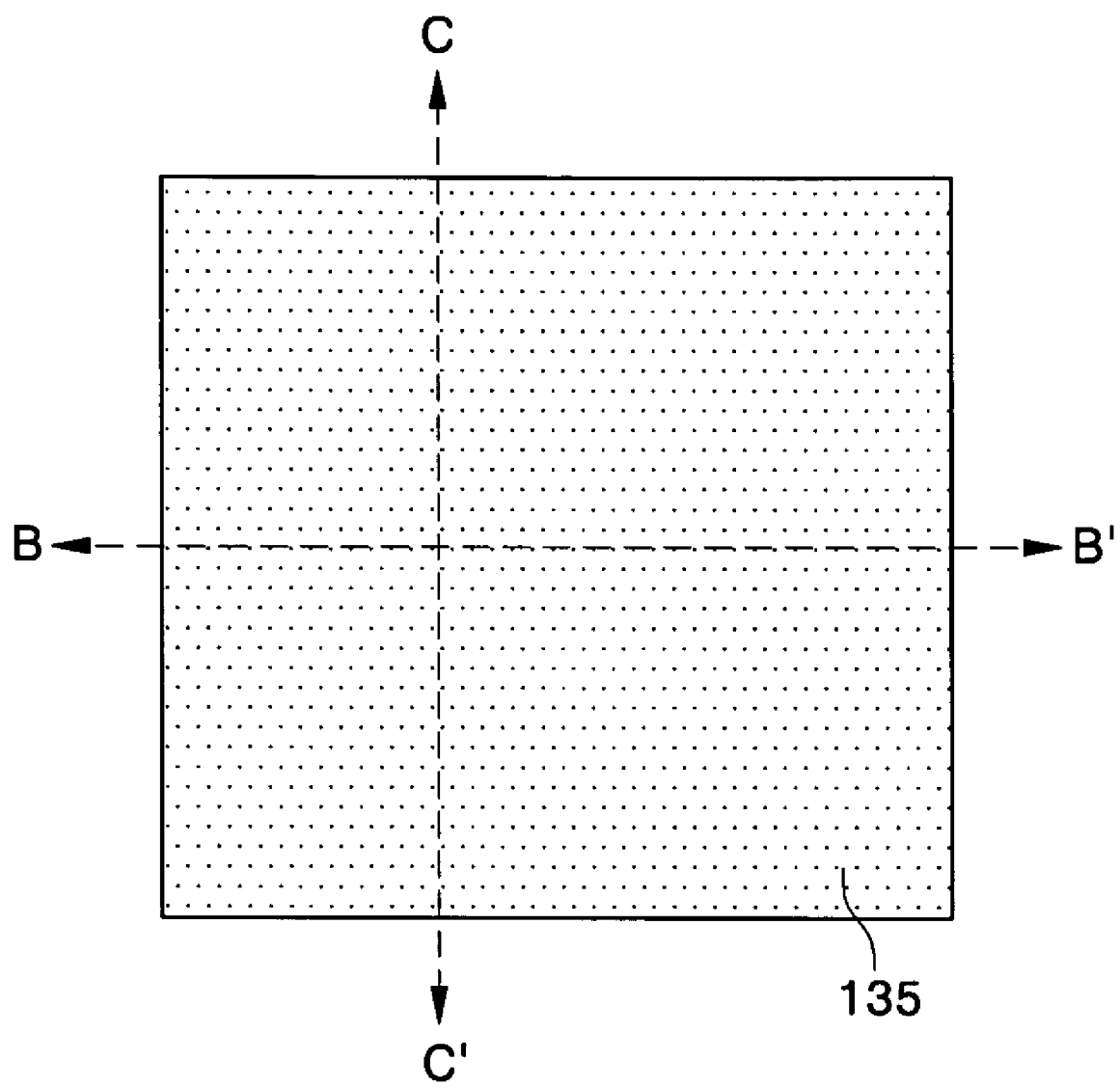
Figure 6B:
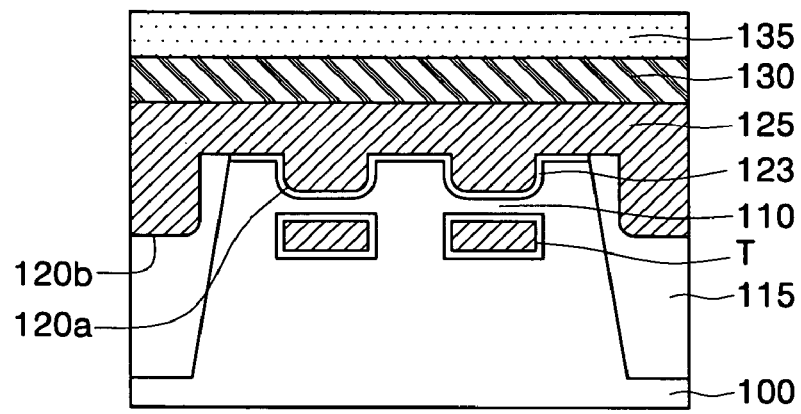
Figure 6C:
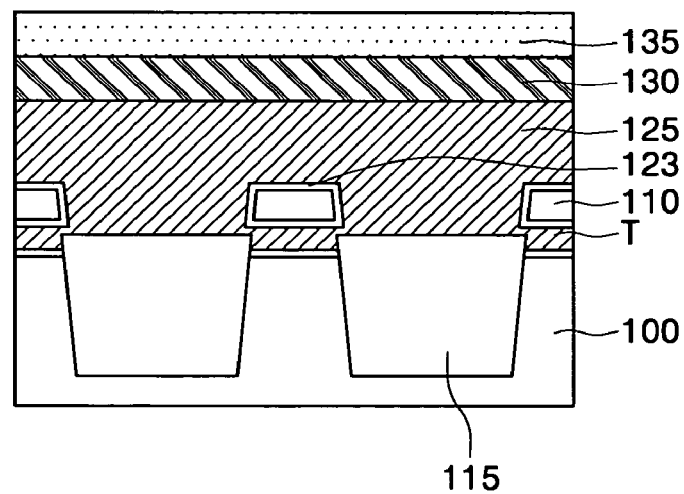

Referring to FIGS. 6A to 6C, the semiconductor substrate having the gate tunnel T is annealed. As a result, a conformal gate oxide layer 123 is formed inside the gate tunnel T and on the active region AR. A gate electrode layer 125 is formed on the semiconductor substrate having the gate oxide layer 123. The gate electrode layer 125 is formed to also fill the inside of the gate tunnel T. The gate electrode layer 125 may be formed of a polysilicon layer. A gate conductive layer 130 and a mask layer 135 may be sequentially formed on the semiconductor substrate having the gate electrode layer 125. The gate conductive layer 130 and the mask layer 135 are preferably formed of a tungsten silicide layer and a silicon nitride layer, respectively.

Figure 7A:
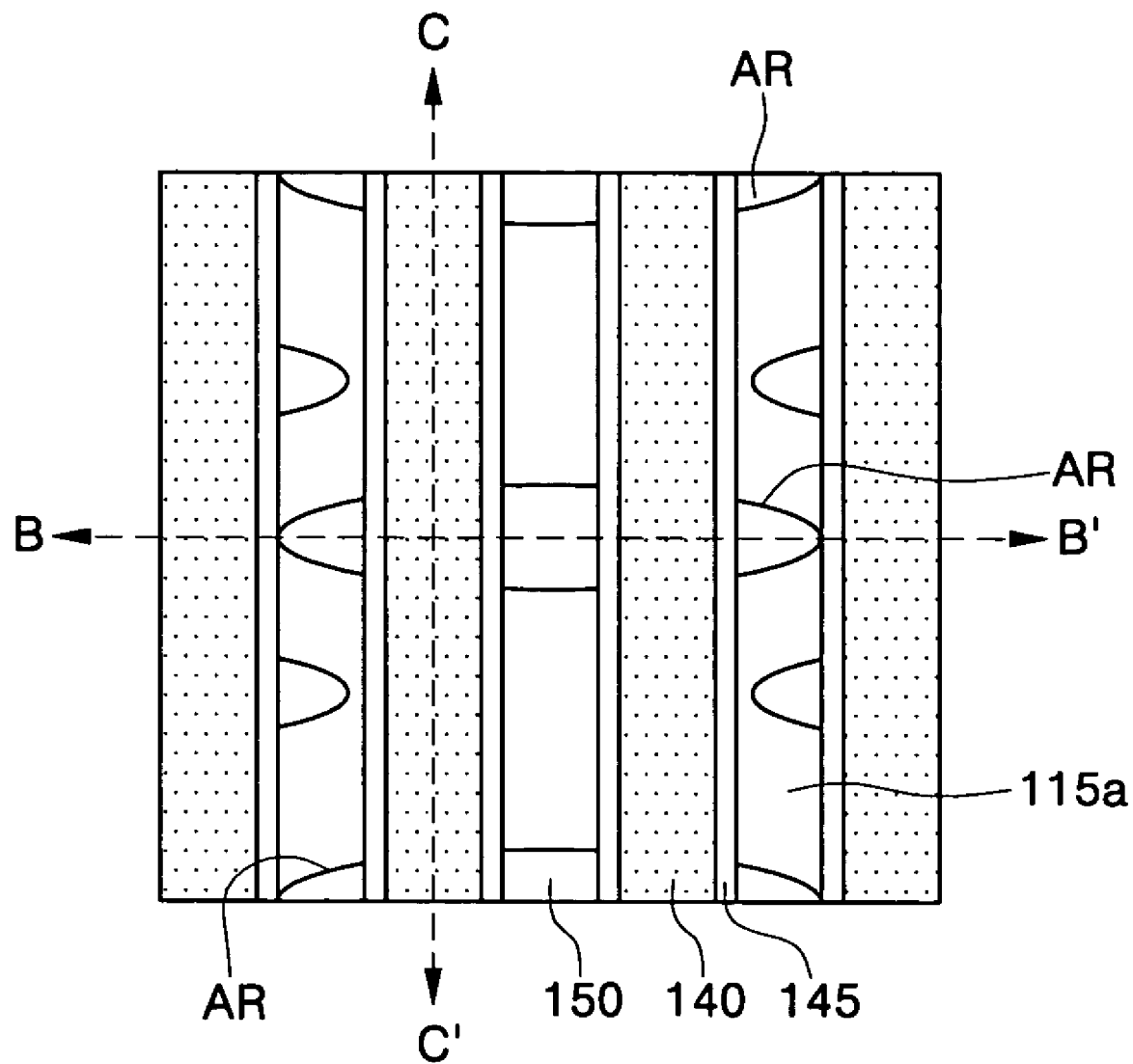
Figure 7B:
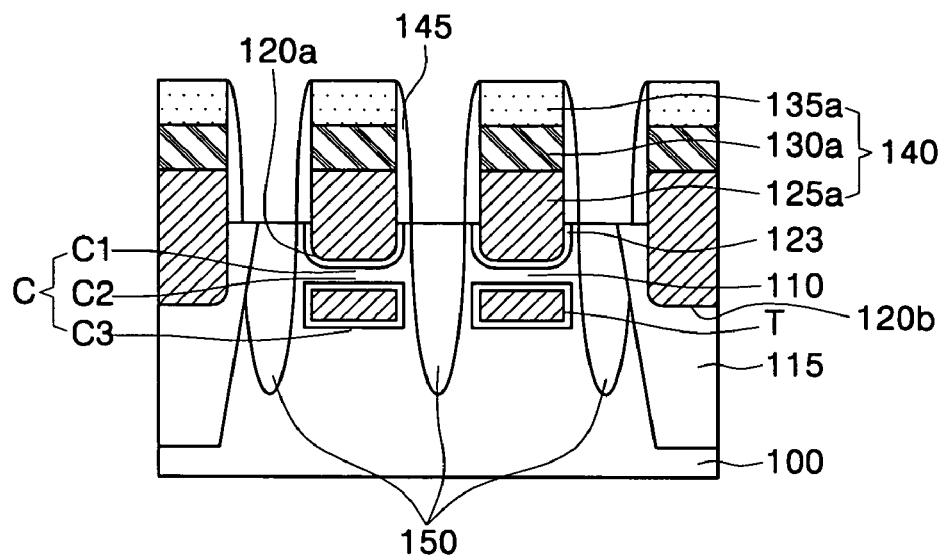
Figure 7C:
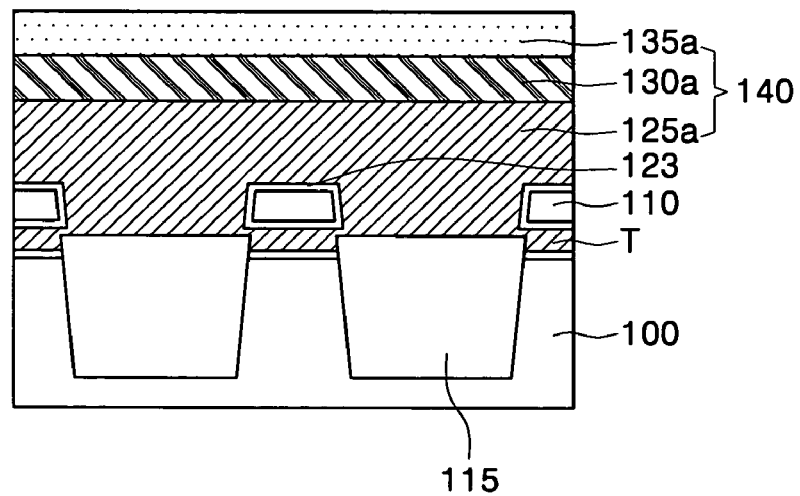

Referring to FIGS. 7A to 7C, the mask layer 135, the gate conductive layer 130, and the gate electrode layer 125 are sequentially patterned, thereby forming gate patterns 140 running across the active regions AR. The gate pattern 140 includes a gate electrode 125a, a gate conductive layer pattern 130a, and a mask pattern 135a, which are sequentially stacked. A conformal spacer layer may be formed on the semiconductor substrate having the gate pattern 140. Then, the spacer layer is etched back, thereby forming gate spacers 145 covering the sidewalls of the gate pattern 140. Impurity ions are implanted into the semiconductor substrate having the gate spacers 145, thereby forming source/drain regions 150 inside the active regions AR. The source/drain regions 150 are preferably formed to have a uniform doping profile in the vertical direction from the upper surface of the active region AR to the depth of the gate tunnel T. The uniform doping profile in the vertical direction can be formed by varying the ion implantation energy during the implantation process of impurity ions.

The MOS transistor fabricated by the processes has a multiple channel C as shown in FIG. 7B. The multiple channel C includes a recess channel C1 formed below the recess region 120a, and gate channels C2, C3 formed on and below the gate tunnel T respectively. Therefore, the recess channel C1 results in increasing a channel length, and the gate channels C2, C3 result in increasing a channel width. As a result, the MOS transistor having the multiple channel C fabricated by the processes provides an advantage of being capable of preventing the short channel effect and the narrow channel effect occurring due to the high integration of the device.

FIGS. 8A to 10A are plan views illustrating a method of fabricating a MOS transistor having a multiple channel according to another embodiment of the present invention. FIGS. 8B to 10B are sectional views taken along a line of B-B' of FIGS. 8A to 10A respectively. Further, FIGS. 8C to 10C are sectional views taken along a line of C-C' of FIGS. 8A to 10A respectively.

Figure 2A:
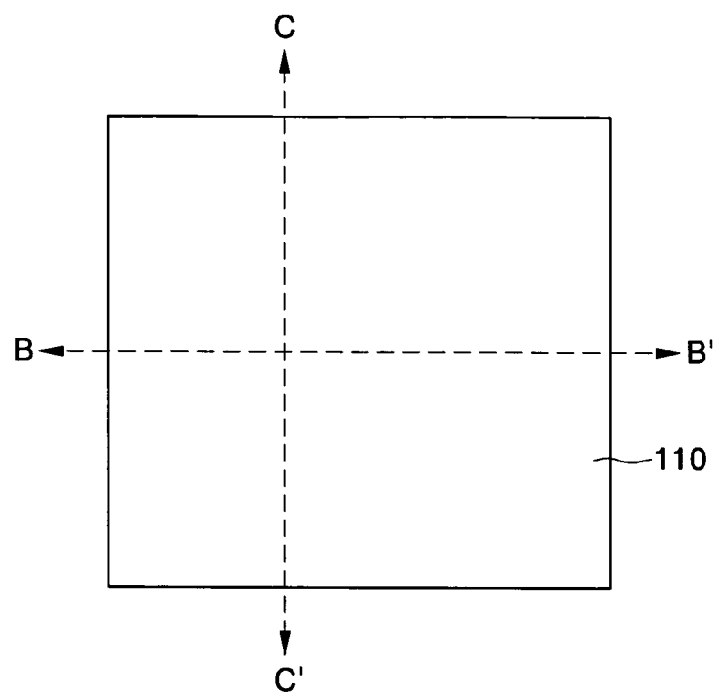
Figure 2B:
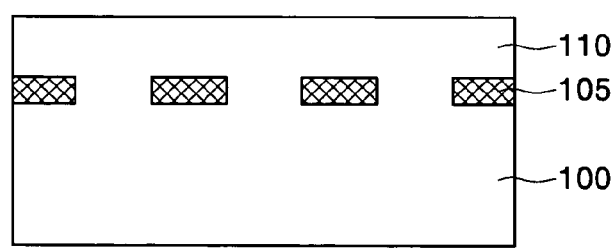
Figure 2C:
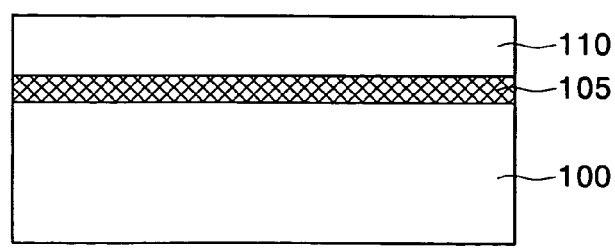
Figure 8A:
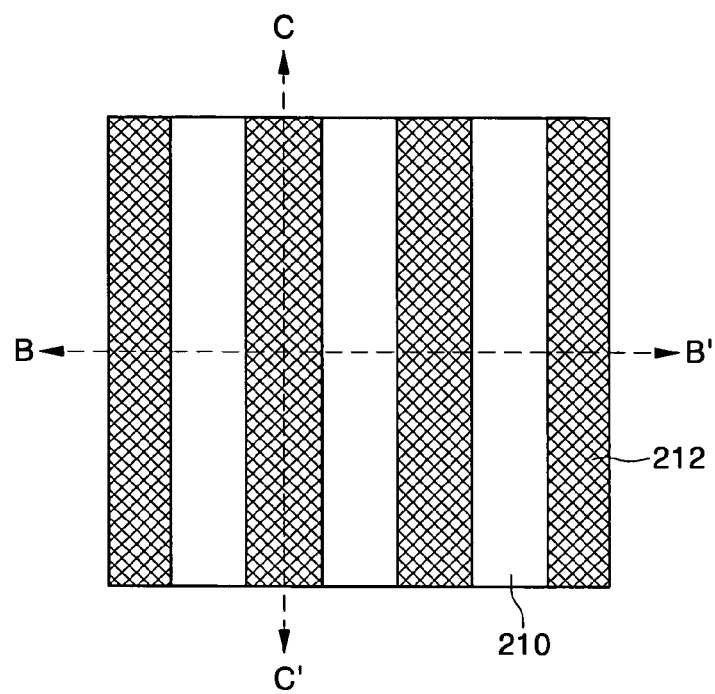
Figure 8B:
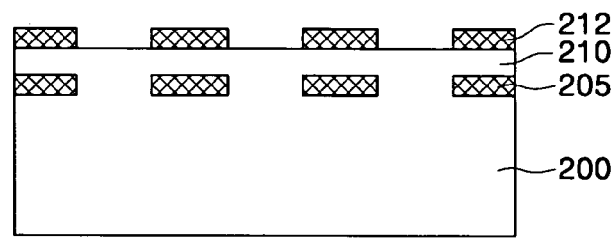
Figure 8C:
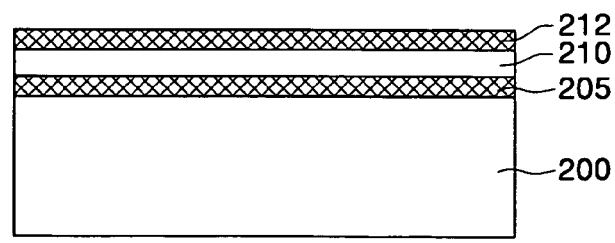

Referring to FIGS. 8A to 8C, a first gate sacrificial layer pattern 205 is formed on a semiconductor substrate 200 as explained in reference to FIGS. 2A to 2C. The first gate sacrificial layer pattern 205 is preferably formed of a material having a wet etch selectivity with respect to silicon and a silicon oxide layer. The first gate sacrificial layer pattern 205 may be formed of SiN or SiGe. Then, a planarized first single crystal silicon layer 210 is formed on the semiconductor substrate having the first gate sacrificial layer pattern 205. A second gate sacrificial layer pattern 212 is formed on the semiconductor substrate having the planarized first single crystal silicon layer 210. The second gate sacrificial layer pattern 212 may be formed of the same material as the first gate sacrificial layer pattern 205. The second gate sacrificial layer pattern 212 is formed in parallel with the first gate sacrificial layer pattern 205 in the vertical direction.

Figure 9A:
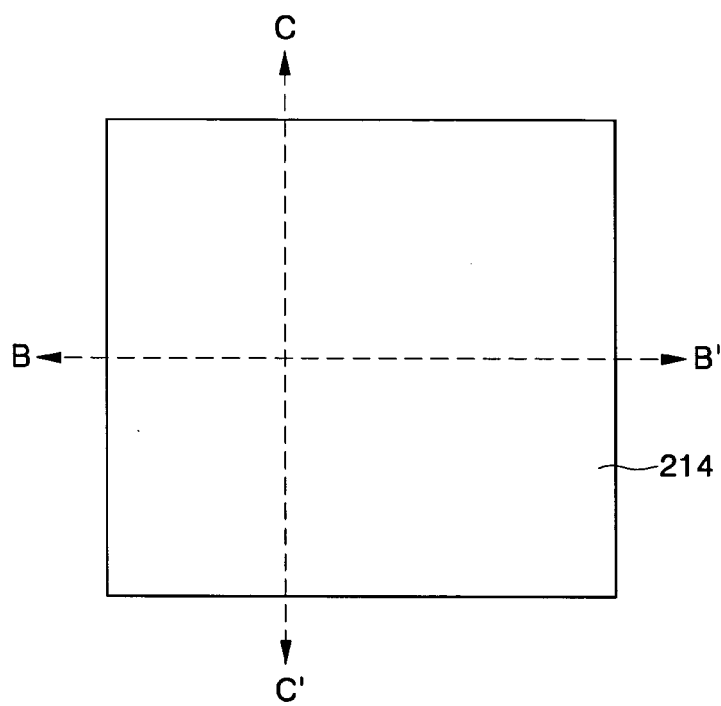
Figure 9B:
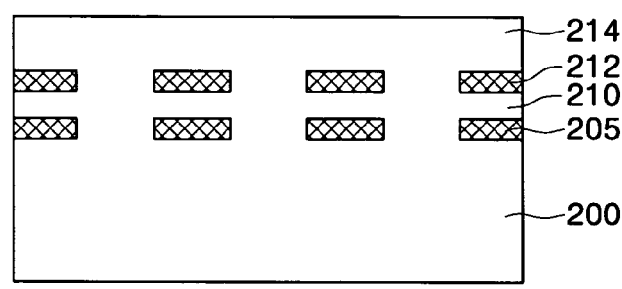
Figure 9C:
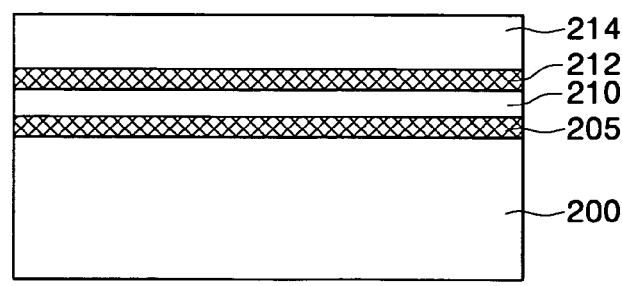

Referring to FIGS. 9A to 9C, a second single crystal silicon layer is formed on the semiconductor substrate having the second gate sacrificial layer pattern 212. The second single crystal silicon layer may be formed by the same method as that of forming the first single crystal silicon layer 210. The second single crystal silicon layer is planarized, thereby forming a planarized second single crystal silicon layer 214. The planarization may be formed by a CMP or etch-back process.

Figure 10A:
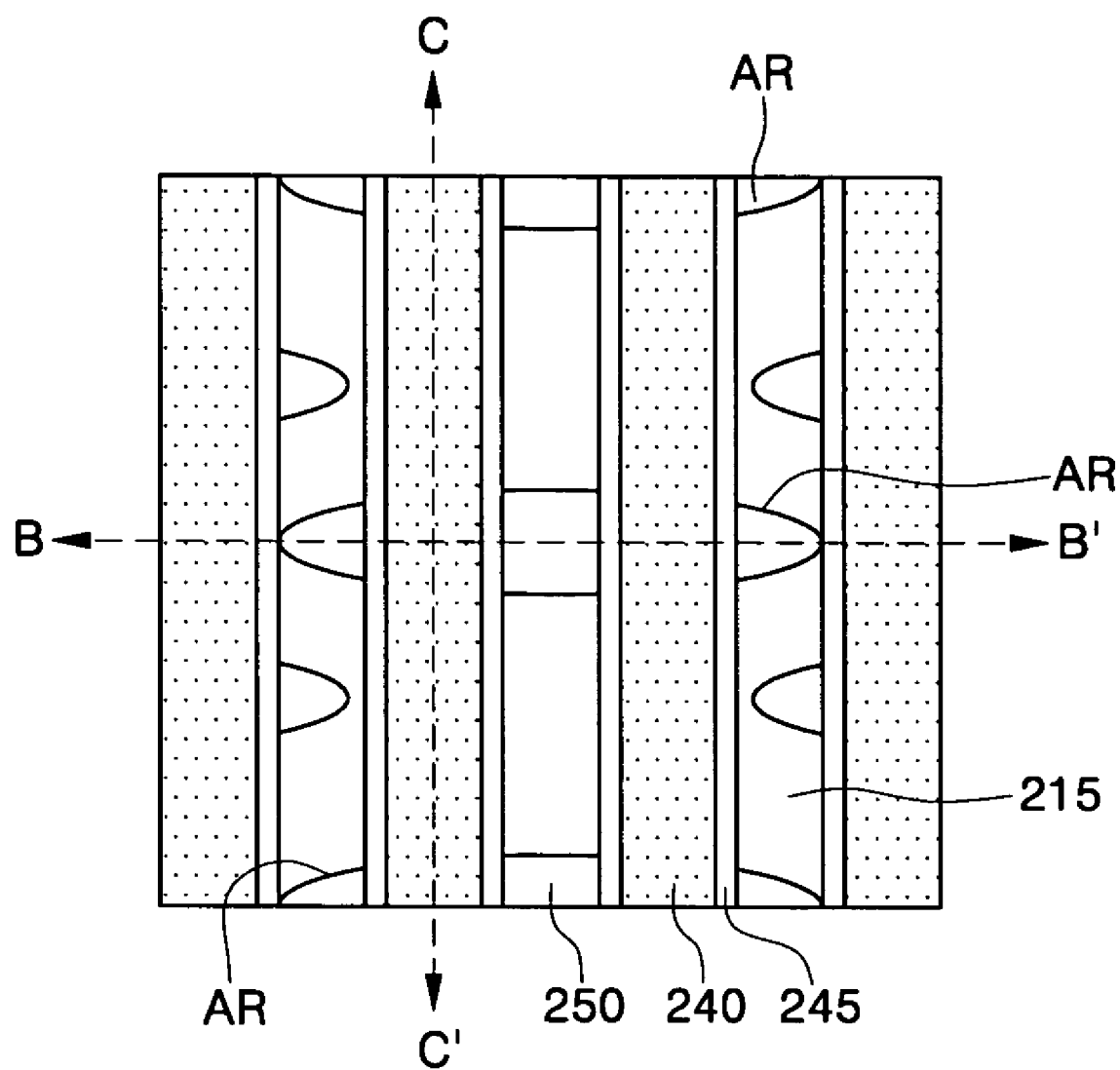
Figure 10B:
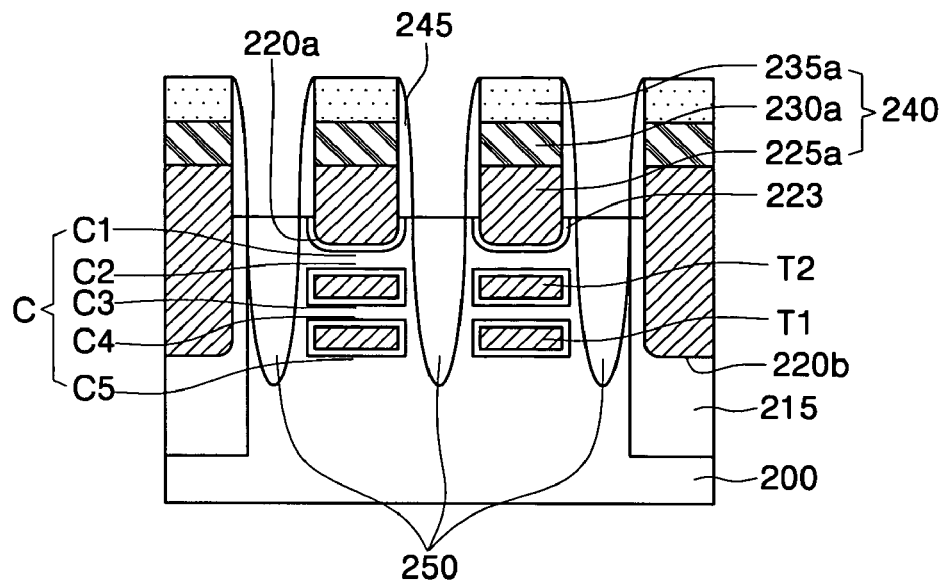
Figure 10C:
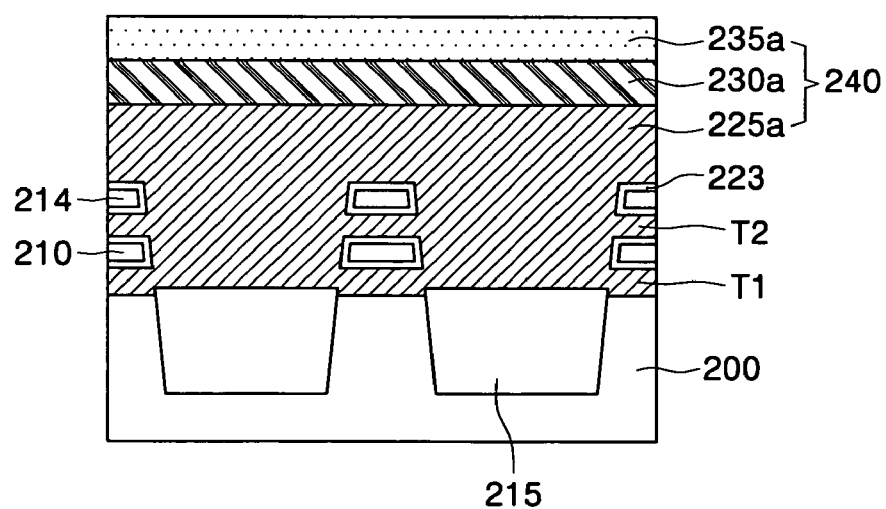
Figure 11A:
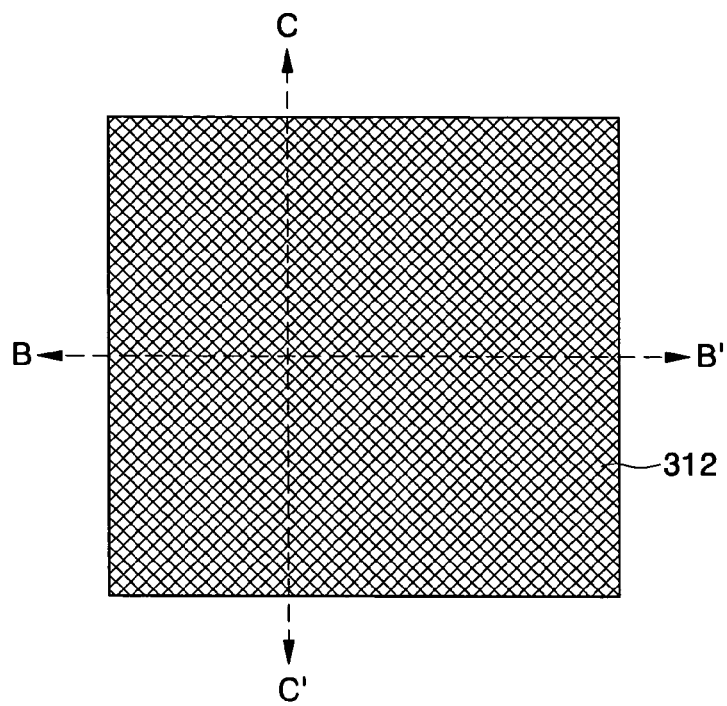
Figure 11B:
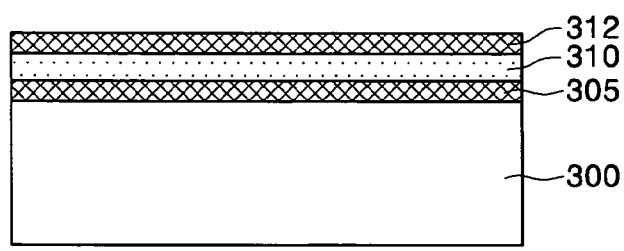
Figure 11C:
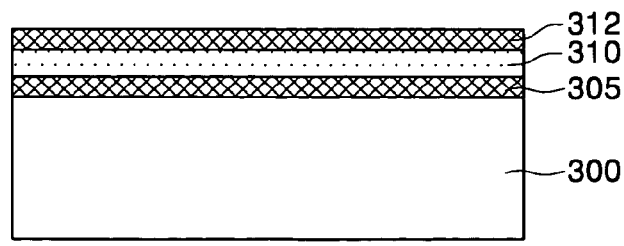

Referring to FIGS. 10A to 10C, a trench isolation layer 215 and an active region AR are formed inside the semiconductor substrate having the planarized second single crystal silicon layer 214 by performing the same processes as those explained in reference to FIGS. 3A to 3C through FIGS. 6A to 6C. The semiconductor substrate having the active region A is recessed to run across the active region AR, thereby forming a recess region 220a of the active region AR and a recess region 220b of the trench isolation layer 215. At this time, since the trench isolation layer 215 is formed of a silicon oxide layer, the trench isolation layer 215 is recessed more quickly than the single crystal silicon of the active region AR. Thus, by controlling conditions of the recessing, the recess region 220a of the active region AR is formed not to expose the gate sacrificial layer pattern 205, and the recess region 220b of the trench isolation layer 215 is formed to expose the first and second gate sacrificial layer patterns 205, 212 through recessed trench sidewalls.

The first and second gate sacrificial layer patterns 205, 212 exposed through the recess region 220b of the trench isolation layer 215 are removed by a wet etch, thereby forming first and second gate tunnels T1, T2 penetrating the inside of the active region AR in the horizontal direction. A conformal gate oxide layer 223 is formed inside the first and second gate tunnels T1, T2 and on the active region AR. A gate pattern 240 is formed on the semiconductor substrate having the gate oxide layer 223 to run across the active region AR. The gate pattern 240 includes a gate electrode 225a, a gate conductive layer pattern 230a, and a mask pattern 235a, which are sequentially stacked. The first and second gate tunnels T1, T2 are formed such that their inner portions are fully filled with the gate electrode 225a. The gate electrode 225a may be formed of a polysilicon layer. The gate conductive layer pattern 230a and the mask pattern 235a are preferably formed of a tungsten silicide layer and a silicon nitride layer respectively. A conformal spacer layer may be formed on the semiconductor substrate having the gate pattern 240. Then, the spacer layer is etched back, thereby forming gate spacers 245 covering the sidewalls of the gate pattern 240.

Impurity ions are implanted into the semiconductor substrate having the gate spacer 245, thereby forming source/drain regions 250 inside the active region AR. The source/drain regions 250 are preferably formed to have a uniform doping profile in the vertical direction from the upper surface of the active region AR to the depth of the first gate tunnel T1. The uniform doping profile in the vertical direction can be formed by varying the ion implantation energy during the implantation process of impurity ions.

The MOS transistor fabricated by the processes has a multiple channel C as shown in FIG. 10B. The multiple channel C includes a recess channel C1 formed below the recess region 220a, gate channels C2, C3 formed on and below the second gate tunnel T2 respectively, and gate channels C4, C5 formed on and below the first gate tunnel T1 respectively. Therefore, the recess channel C1 results in increasing a channel length, and the gate channels C2, C3, C4, C5 result in increasing a channel width. As a result, the MOS transistor having the multiple channel C fabricated by the processes provides an advantage of being capable of preventing the short channel effect and the narrow channel effect occurring due to the high integration of the device.

Further, more gate tunnels may be formed in the vertical direction in order to increase the number of the gate channels.

FIGS. 11A to 15A are plan views illustrating a method of fabricating a MOS transistor having a multiple channel according to still another embodiment of the present invention. FIGS. 11B to 15B are sectional views taken along a line of B-B' of FIGS. 11A to 15A respectively. Further, FIGS. 11C to 15C are sectional views taken along a line of C-C' of FIGS. 11A to 15A, respectively. Referring to FIGS. 11A to 15A, a first gate sacrificial layer 305 is formed on a semiconductor substrate 300. The first gate sacrificial layer 305 is preferably formed of a material having a wet etch selectivity with respect to silicon and silicon oxide. The first gate sacrificial layer 305 may be formed of SiN or SiGe. An interlayer amorphous silicon layer 310 is formed on the first gate sacrificial layer 305. Then, a second gate sacrificial layer 312 is formed on the interlayer amorphous silicon layer 310. The second gate sacrificial layer 312 may be the same material as that of the first gate sacrificial layer 305. More gate sacrificial layers may be further formed on the second gate sacrificial layer 312 with an interlayer amorphous silicon layer between them.

Figure 12A:
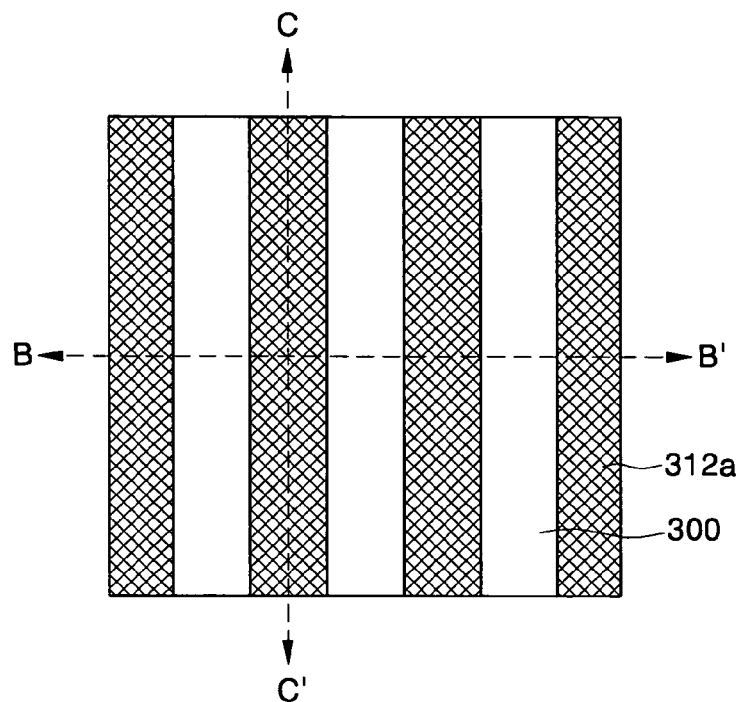
Figure 12B:
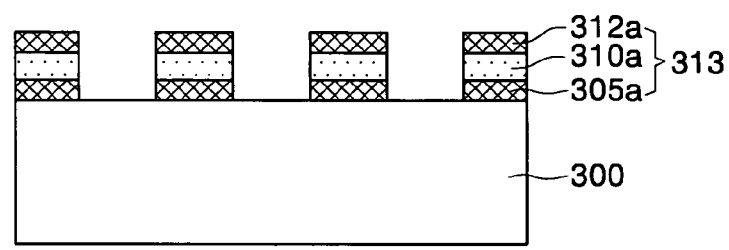
Figure 12C:
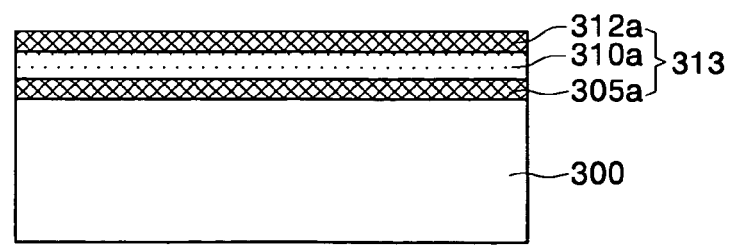

Referring to FIGS. 12A to 12C, a line and space shaped photoresist pattern is formed on the second gate sacrificial layer 312. The second gate sacrificial layer 312, the interlayer amorphous silicon layer 310, and the first gate sacrificial layer 305 are sequentially etched by a dry etch using the photoresist pattern as a mask, thereby forming a mold gate pattern 313. The mold gate pattern 313 includes a first gate sacrificial layer pattern 305a, an interlayer amorphous silicon layer pattern 310a, and a second gate sacrificial layer pattern 312a, which are sequentially stacked.

Figure 13A:
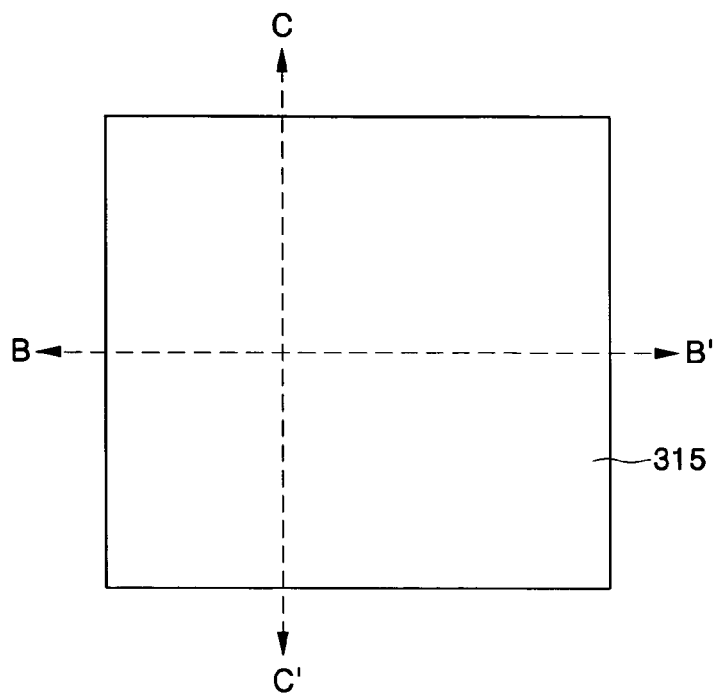
Figure 13B:
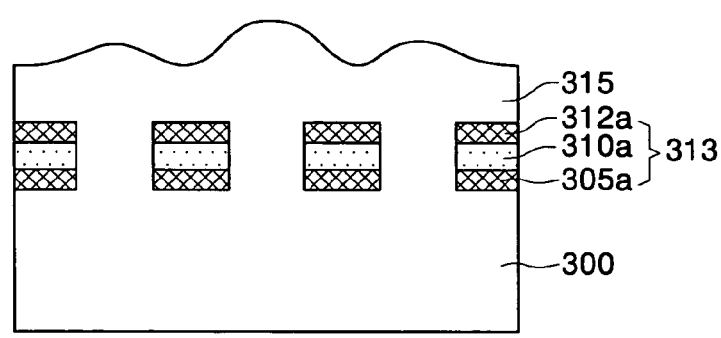
Figure 13C:
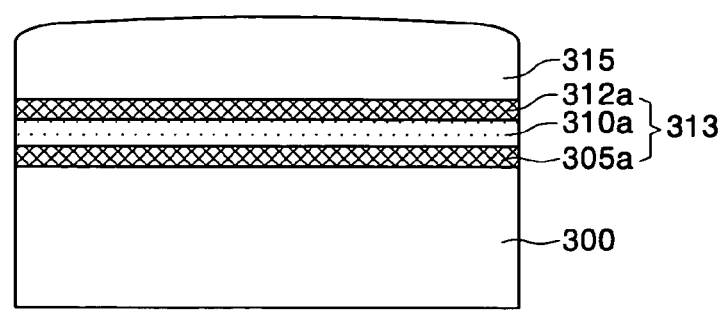

Referring to FIGS. 13A to 13C, an upper single crystal silicon layer 315 is formed on the semiconductor substrate having the mold gate pattern 313. The upper single crystal silicon layer 315 may be formed to cover the mold gate pattern 313 using a silicon epitaxy method.

Figure 14A:
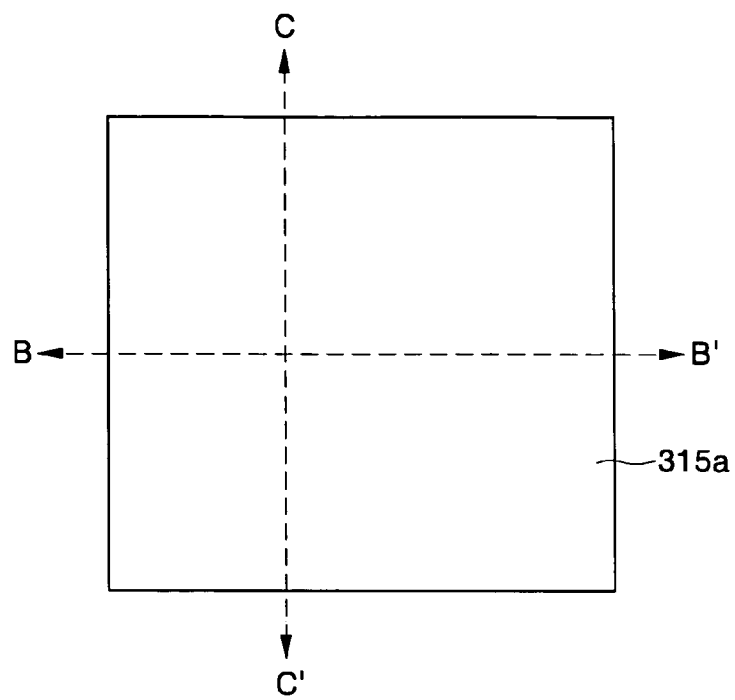
Figure 14B:
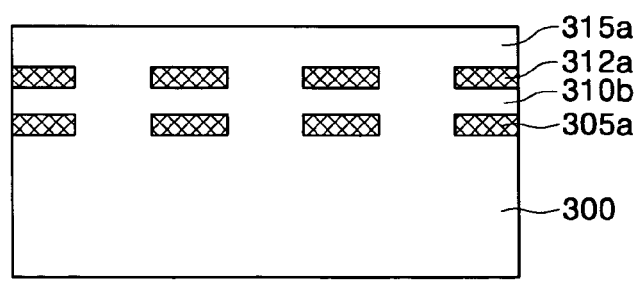
Figure 14C:
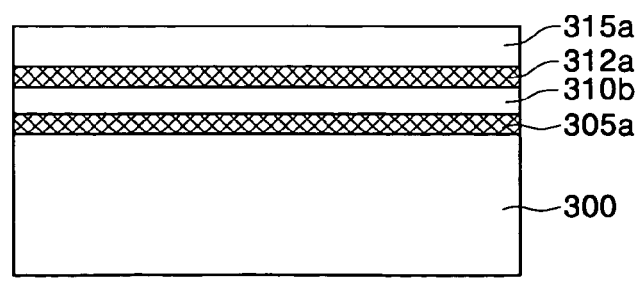

Referring to FIGS. 14A to 14C, the semiconductor substrate having the upper single crystal silicon layer 315 is annealed to single-crystallize the interlayer amorphous silicon layer pattern 310a, thereby forming an interlayer single crystal silicon layer pattern 310b. Then, the upper single crystal silicon layer 315 may be planarized. As a result, a planarized single crystal silicon layer 315a is formed. The planarization may be performed using a CMP or etch-back process. Then, subsequent processes are performed in the same ways as explained in reference to FIGS. 3A to 3C through FIGS. 6A to 6C, thereby forming a MOS transistor having a multiple channel as shown in FIGS. 10A to 10C.

Figure 15A:
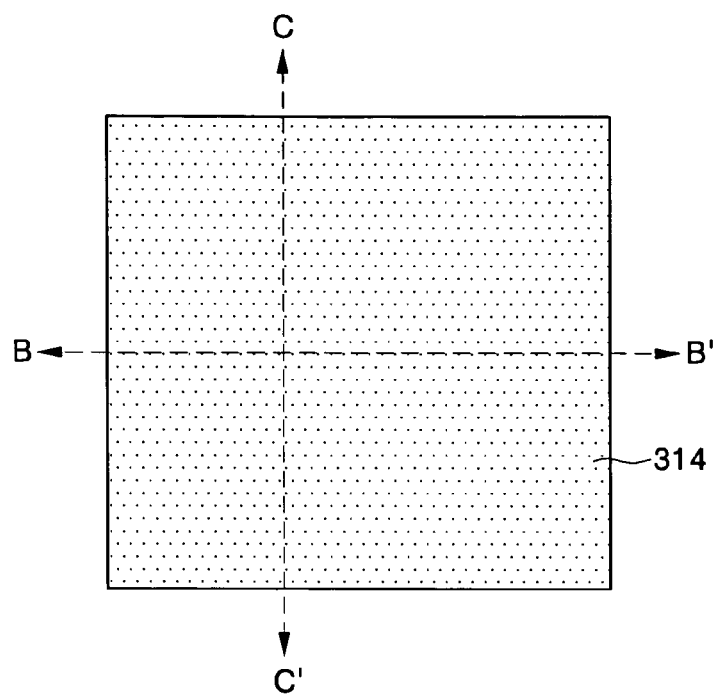
Figure 15B:
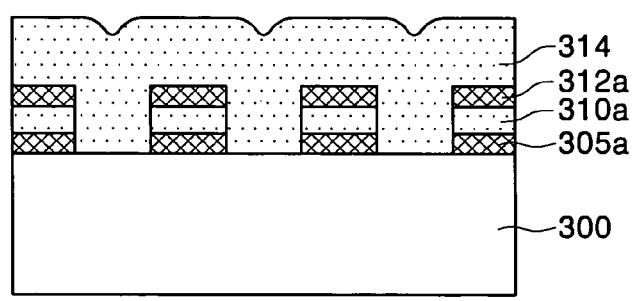
Figure 15C:
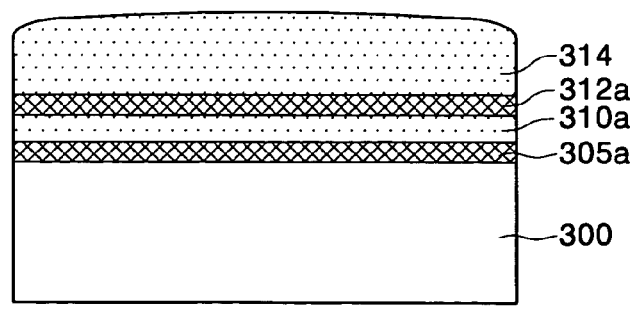

Alternatively, a MOS transistor having a multiple channel illustrated in FIGS. 14A to 14C can be fabricated by a different method. Referring to FIGS. 15A to 15C, an upper amorphous silicon layer 314 may be formed on the semiconductor substrate having the mold gate pattern 313 illustrated in FIGS. 12A to 12C. The upper amorphous silicon layer 314 is formed to fully cover the mold gate pattern 313. Then, the semiconductor substrate having the upper amorphous silicon layer 314 may be annealed to single-crystallize the interlayer amorphous silicon layer pattern 310a and the upper amorphous silicon layer 314, thereby forming the interlayer single crystal silicon layer pattern 310b and the upper single crystal silicon layer 315 as shown in FIGS. 14A to 14B. Then, the upper single crystal silicon layer 315 may be planarized. As a result, a planarized single crystal silicon layer 315a is formed. The planarization may be performed using a CMP or etch-back process.

As described above, according to the present invention, a channel is formed on and below a gate tunnel by forming a single crystal silicon layer to have a gate sacrificial layer pattern thereinside, removing the gate sacrificial layer pattern to form the gate tunnel, and filling the gate tunnel with a gate electrode layer. Thus, the width of the channel is increased. Further, the length of the channel can be also increased by forming a recessed channel during the process of forming the gate tunnel. Therefore, the short channel effect and the narrow channel effect due to the high integration of the device can be all prevented.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a field effect transistor, comprising the steps of:
    forming a semiconductor substrate having a sacrificial gate electrode buried beneath a surface of the semiconductor substrate;
    forming a trench isolation region in the substrate;
    etching back a portion of the trench isolation region to thereby expose a portion of the sacrificial gate electrode while concurrently etching a recess in a portion of the semiconductor substrate extending opposite the sacrificial gate electrode;
    removing the sacrificial gate electrode to define a gate electrode cavity beneath the surface;
    lining the gate electrode cavity and the recess with respective gate insulating layers by thermally oxidizing exposed surfaces of the gate electrode cavity and a surface of the recess;
    filling the lined gate electrode cavity with a first insulated gate electrode;
    forming a second insulated gate electrode that extends into the recess, to thereby define a channel region of the field effect transistor extending between the first and second insulated gate electrodes; and
    forming source and drain regions adjacent opposite ends of the first and second insulated gate electrodes.

2. The method of claim 1, wherein said removing step comprises applying a wet etchant to the exposed portion of the sacrificial gate electrode.

3. The method of claim 1, wherein said step of forming a trench isolation region comprises etching a trench into the substrate and filling the etched trench with an electrically insulating material.

4. The method of claim 1, wherein the sacrificial gate electrode comprises a material selected from a group consisting of silicon nitride and silicon germanium.

5. The method of claim 1, wherein said step of forming a semiconductor substrate comprises:
    forming a sacrificial gate electrode material layer on a surface of a bulk semiconductor substrate;
    patterning the sacrificial gate electrode material layer to define at least a sacrificial gate electrode;
    covering the sacrificial gate electrode with a semiconductor layer comprising silicon; and
    planarizing the semiconductor layer.

6. The method of claim 5, wherein the sacrificial gate electrode material layer comprises a material selected from a group consisting of silicon nitride and silicon germanium.

7. The method of claim 5, wherein said covering step comprises epitaxially growing the semiconductor layer as a single crystal silicon layer.

8. The method of claim 5, wherein said covering step comprises depositing the semiconductor layer as an amorphous silicon layer.

9. The method of claim 8, further comprising the step of recrystallizing the amorphous silicon layer.

10. A method of fabricating a MOS transistor comprising:
stacking at least two gate sacrificial layers on a semiconductor substrate and forming a gate amorphous silicon layer between the gate sacrificial layers;
sequentially patterning the gate sacrificial layers and the gate amorphous silicon layer, thereby forming a mold gate pattern, the mold gate pattern including gate sacrificial layer patterns and gate amorphous silicon patterns;
epitaxially growing a single crystal silicon layer from the semiconductor substrate, said single crystal silicon layer extending up through openings in the mold gate pattern and covering the mold gate pattern;
annealing the semiconductor substrate having the single crystal silicon layer, so as to single-crystallize the gate amorphous silicon patterns;
planarizing the single crystal silicon layer;
forming a trench isolation layer inside the semiconductor substrate having the planarized single crystal silicon layer so as to define an active region;
recessing the semiconductor substrate having the active region to thereby define a recess that runs across the active region so that the gate sacrificial layer patterns are exposed through recessed trench sidewalls;
removing the gate sacrificial layer patterns by a wet etch, thereby forming a gate tunnel;
annealing the semiconductor substrate, thereby forming a conformal gate oxide layer inside the gate tunnel and on the recess in the active region;
forming a gate electrode layer on the semiconductor substrate having the gate oxide layer so as to fully fill the gate tunnel; and
patterning the gate electrode layer, thereby forming a gate pattern running across the active region.

11. The method according to claim 10, wherein the gate sacrificial layers are formed of SiN or SiGe.

12. The method according to claim 10, after forming the gate pattern, further comprising implanting impurity ions into the active region, thereby forming source/drain regions, wherein the source/drain regions are formed to have a uniform doping profile in the vertical direction from an upper surface of the active region to the depth of the gate tunnel.

13. A method of fabricating a MOS transistor comprising:
stacking at least two gate sacrificial layers on a semiconductor substrate and forming a gate amorphous silicon layer between the gate sacrificial layers;
sequentially patterning the gate sacrificial layers and the gate amorphous silicon layer, thereby forming a mold gate pattern, the mold gate pattern including gate sacrificial layer patterns and gate amorphous silicon patterns;
forming an amorphous silicon layer on the mold gate pattern, said amorphous silicon layer extending up through openings in the mold gate pattern and covering the mold gate pattern;
annealing the semiconductor substrate having the amorphous silicon layer, so as to single-crystallize the amorphous silicon layer and the gate amorphous silicon patterns;
planarizing the single crystal silicon layer;
forming a trench isolation layer inside the semiconductor substrate having the planarized single crystal silicon layer so as to define an active region;
recessing the semiconductor substrate having the active region thereby define a recess that runs to across the active region so that the gate sacrificial layer patterns are exposed through recessed trench sidewalls;
removing the gate sacrificial layer patterns by a wet etch, thereby forming a gate tunnel;
annealing the semiconductor substrate, thereby forming a conformal gate oxide layer inside the gate tunnel and on the recess in the active region;
forming a gate electrode layer on the semiconductor substrate having the gate oxide layer so as to fully fill the gate tunnel; and
patterning the gate electrode layer, thereby forming a gate pattern running across the active region.

14. The method according to claim 13, wherein the gate sacrificial layers are formed of SiN or SiGe.

* * * * *